United States Patent
Yamafuku et al.

(10) Patent No.: US 10,634,729 B2
(45) Date of Patent: Apr. 28, 2020

(54) DETERIORATION DETECTOR FOR NON-AQUEOUS ELECTROLYTE POWER STORAGE ELEMENT, POWER STORAGE DEVICE, DETERIORATION DETECTION SYSTEM FOR NON-AQUEOUS ELECTROLYTE POWER STORAGE ELEMENT, AND DETERIORATION DETECTION METHOD FOR NON-AQUEOUS ELECTROLYTE POWER STORAGE ELEMENT

(71) Applicant: GS Yuasa International Ltd., Kyoto-shi (JP)

(72) Inventors: Taro Yamafuku, Kyoto (JP); Masaki Masuda, Kyoto (JP); Kazuki Kawaguchi, Kyoto (JP); Masashi Takano, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 267 days.

(21) Appl. No.: 15/554,694

(22) PCT Filed: Mar. 14, 2016

(86) PCT No.: PCT/JP2016/058016
§ 371 (c)(1),
(2) Date: Aug. 30, 2017

(87) PCT Pub. No.: WO2016/158354
PCT Pub. Date: Oct. 6, 2016

(65) Prior Publication Data
US 2018/0080996 A1    Mar. 22, 2018

(30) Foreign Application Priority Data

Mar. 27, 2015 (JP) .................................. 2015-067018

(51) Int. Cl.
*G01R 31/392* (2019.01)
*G01R 31/389* (2019.01)
(Continued)

(52) U.S. Cl.
CPC ......... *G01R 31/392* (2019.01); *G01R 31/389* (2019.01); *H01M 10/425* (2013.01);
(Continued)

(58) Field of Classification Search
CPC ... G01R 31/392; G01R 31/389; H02J 7/0077; H02J 7/0073; H01M 10/425; H01M 10/48
See application file for complete search history.

(56) References Cited

U.S. PATENT DOCUMENTS

| 2006/0066285 | A1 | 3/2006 | Minamiura |
| 2009/0112496 | A1 | 4/2009 | Suzuki |
| 2011/0187312 | A1* | 8/2011 | Yamamoto .......... H01M 10/425 320/101 |
| 2011/0221392 | A1* | 9/2011 | Gale ...................... B60L 58/15 320/109 |
| 2014/0184172 | A1 | 7/2014 | Momo et al. |
| 2017/0101021 | A1 | 4/2017 | Momo et al. |

FOREIGN PATENT DOCUMENTS

| JP | H 11-174136 A | 7/1999 |
| JP | 2006-126172 A | 5/2006 |

(Continued)

OTHER PUBLICATIONS

International Search Report (ISR) (PCT Form PCT/ISA/210), in PCT/JP2016/058016, dated Jun. 7, 2016.

*Primary Examiner* — Daniel R Miller
(74) *Attorney, Agent, or Firm* — McGinn IP Law Group, PLLC

(57) ABSTRACT

According to an embodiment of the present invention, deterioration of a non-aqueous electrolyte power storage (Continued)

element is detected based on a first increase rate and a second increase rate, the first increase rate being an increase rate of a direct current resistance value obtained by measuring the non-aqueous electrolyte power storage element over a first time period, the second increase rate being an increase rate of a direct current resistance value obtained by measuring the non-aqueous electrolyte power storage element over a second time period that is longer than the first time period.

20 Claims, 10 Drawing Sheets

(51) Int. Cl.
    *H01M 10/48*     (2006.01)
    *H01M 10/42*     (2006.01)
    *H02J 7/00*     (2006.01)

(52) U.S. Cl.
    CPC ........... *H01M 10/48* (2013.01); *H02J 7/0077* (2013.01); *H02J 7/0073* (2013.01)

(56) References Cited

FOREIGN PATENT DOCUMENTS

| | | | |
|---|---|---|---|
| JP | 2009-112113 | A | 5/2009 |
| JP | 2010-211990 | A | 9/2010 |
| JP | 2011-257314 | A | 12/2011 |
| JP | 2013-031248 | A | 2/2013 |
| JP | 2013-205125 | A | 10/2013 |
| JP | 2014-003826 | A | 1/2014 |
| JP | 2014-071098 | A | 4/2014 |
| JP | 2014-143185 | A | 8/2014 |
| JP | 2014-217179 | A | 11/2014 |
| JP | 2015-025751 | A | 2/2015 |
| JP | 2015-045523 | A | 3/2015 |
| WO | WO 2014/054548 | A1 | 4/2014 |

\* cited by examiner

DETERIORATION DETECTOR FOR NON-AQUEOUS ELECTROLYTE POWER STORAGE ELEMENT, POWER STORAGE DEVICE, DETERIORATION DETECTION SYSTEM FOR NON-AQUEOUS ELECTROLYTE POWER STORAGE ELEMENT, AND DETERIORATION DETECTION METHOD FOR NON-AQUEOUS ELECTROLYTE POWER STORAGE ELEMENT

CROSS-REFERENCES TO RELATED APPLICATION

This application claims priority to Japanese Patent Application No. 2015-067018, which is incorporated herein by reference.

TECHNICAL FIELD

The present invention relates to a deterioration detector for a non-aqueous electrolyte power storage element, a power storage device, a deterioration detection system for the non-aqueous electrolyte power storage element, and a deterioration detection method for the non-aqueous electrolyte power storage element.

BACKGROUND ART

In general, a non-aqueous electrolyte power storage element includes an electrode assembly having a positive electrode and a negative electrode, a case containing the electrode assembly, and an electrolyte solution contained in the case. The positive electrode includes a metal foil, and a positive active material that covers a surface of the metal foil. Examples of the positive active material include various types. One example that is used is an active material in which two phases, i.e. a first phase that exists before discharge and a second phase that appears later, coexist (two-phase reaction type active material). Examples of the two-phase reaction type active material include $LiFePO_4$ (lithium iron phosphate) (cf., patent document 1).

Charging and discharging of a non-aqueous electrolyte power storage element is performed by lithium ions moving between a positive electrode and a negative electrode. With the two-phase reaction type active material, lithium ions are not easily diffused, upon charging and discharging, the lithium ions moved to the positive electrode are diffused unevenly within the two-phase reaction type active material of the positive electrode. As a result of this, in the positive electrode, a region in which the lithium ions are diffused and thus contribution to charging and discharging is made, and a region in which the lithium ions are not diffused and thus no contribution to charging and discharging is made are formed. Then, it become difficult for the lithium ions to be diffused in the positive electrode after repeated charging and discharging to the non-aqueous electrolyte power storage element, the region in which no contribution to charging and discharging is made gradually increases.

When the region in which no contribution to charging and discharging is made increases in the positive electrode in this manner, in the non-aqueous electrolyte power storage element, degradation of a charge-discharge performance, which is greater than degradation of a charge-discharge performance produced by deterioration of the positive active material, an electrolyte solution, and the like due to repetition of charging and discharging, is produced. If charging and discharging are continued repeatedly in this state, the region in which no contribution to charging and discharging is made increase even more, and deterioration of the positive electrode becomes apparent.

PRIOR ART DOCUMENT

Patent Document

Patent Document 1: JP-A-2010-211990

SUMMARY OF THE INVENTION

Problems to be Solved by the Invention

An object of an embodiment of the present invention is to provide a deterioration detector capable of detecting deterioration of a non-aqueous electrolyte power storage element for a non-aqueous electrolyte power storage element, a power storage device, a deterioration detection system for a non-aqueous electrolyte power storage element, and a deterioration detection method for a non-aqueous electrolyte power storage element.

Means for Solving the Problems

A deterioration detector for a non-aqueous electrolyte power storage element according to the embodiment includes:
a control unit, wherein
the control unit detects deterioration of a non-aqueous electrolyte power storage element based on a first increase rate and a second increase rate, the first increase rate being an increase rate of a direct current resistance value obtained by measuring the non-aqueous electrolyte power storage element over a first time period, the second increase rate being an increase rate of a direct current resistance value obtained by measuring the non-aqueous electrolyte power storage element over a second time period that is longer than the first time period.

MODE FOR CARRYING OUT THE INVENTION

Figure 1:
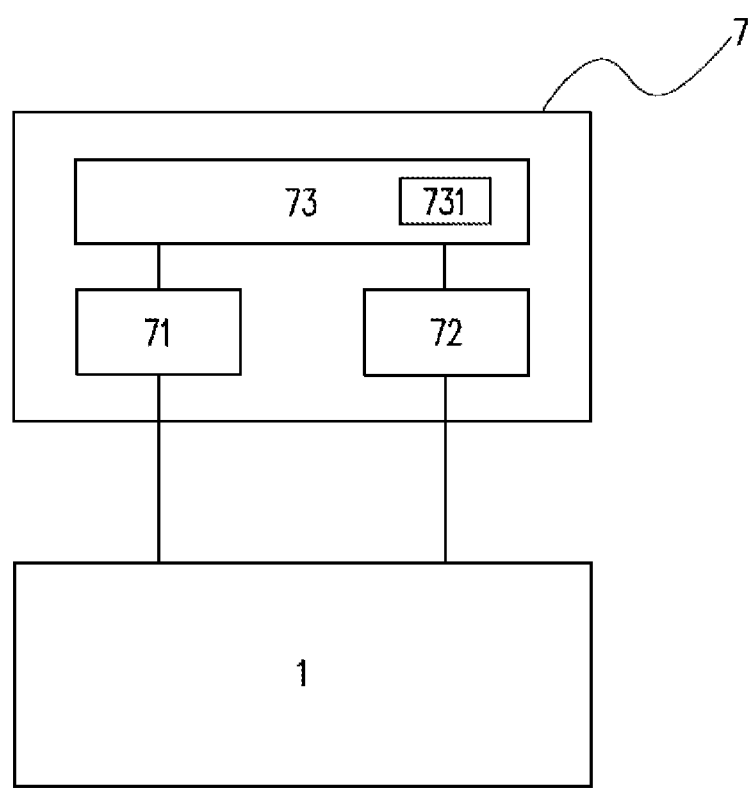
FIG. 1 is a block diagram of a non-aqueous electrolyte power storage element and a deterioration detection system for the non-aqueous electrolyte power storage element according to an embodiment of the present invention.

The inventors of the present invention have conducted a study to the full extent in order to solve the above problem, and have found as a result that it is possible to detect, based on increase rates of a direct current resistance value of a non-aqueous electrolyte power storage element respectively measured over two measurement time periods, degradation of a charge-discharge performance due to expansion of a region in which no contribution to charging and discharging is made in a positive electrode, that is, deterioration of the non-aqueous electrolyte power storage element. Specifically, the deterioration of the non-aqueous electrolyte power storage element may be detected, based on a difference between an increase rate of a direct current resistance value measured over a first measurement time period (first time period) and an increase rate of a direct current resistance value measured over a second measurement time period that is longer than the first measurement time period (second time period).

The inventors have also found that the higher an SOC (State Of Charge) is, the more noticeable the difference between the increase rates becomes. Specifically, the difference between the increase rates becomes noticeable in a case in which the direct current resistance value of the power storage device is measured in a high SOC state in which the SOC is 50% or higher and 100% or lower.

Therefore, based on these findings, the inventors have invented a deterioration detector for a non-aqueous electrolyte power storage element, a power storage device, a deterioration detection system for a non-aqueous electrolyte power storage element, and a deterioration detection method for a non-aqueous electrolyte power storage element, that are provided with the following configurations.

A deterioration detection system for a non-aqueous electrolyte power storage element according to one aspect of the embodiment includes:

a charging unit configured to charge a non-aqueous electrolyte power storage element;

a measuring unit configured to measure the direct current resistance value of the non-aqueous electrolyte power storage element that is being charged; and a detecting unit (deterioration detector) configured to detect deterioration of the electrode assembly based on a first increase rate and a second increase rate, the first increase rate being an increase rate of a direct current resistance value obtained by measuring by the measuring unit over a first measurement time period, the second increase rate being an increase rate of a direct current resistance value obtained by measuring by the measuring unit over a second measurement time period that is longer than the first measurement time period.

Preferably, the non-aqueous electrolyte power storage element includes an electrode assembly having a two-phase reaction type active material.

According to this configuration, it is possible to detect deterioration of the non-aqueous electrolyte power storage element due to uneven diffusion of lithium ions moved to a positive electrode within the active material, that is, degradation (deterioration) of the charge-discharge performance due to expansion of a region in which no contribution to charging and discharging is made in the positive electrode.

As the first increase rate, it is possible to employ an increase rate of a second direct current resistance value to a first direct current resistance value, the first direct current resistance value being obtained by measuring by the measuring unit over the first measurement time period, the second direct current resistance value being obtained by measuring by the measuring unit over the first measurement time period after the first direct current resistance value has been obtained.

As the second increase rate, it is possible to employ an increase rate of a fourth direct current resistance value to a third direct current resistance value, the third direct current resistance value being obtained by measuring by the measuring unit over the second measurement time period when the first direct current resistance value is obtained, the fourth direct current resistance value being obtained by measuring by the measuring unit over the second measurement time period when the second direct current resistance value is obtained.

According to the deterioration detection system for a non-aqueous electrolyte power storage element, the direct current values of the non-aqueous electrolyte power storage element are measured for two different measurement time periods respectively before and after a use of the non-aqueous electrolyte power storage element (at a first time point and a second time point). With this, deterioration of the non-aqueous electrolyte power storage element (degradation in the charge-discharge performance) may be detected.

According to the deterioration detection system for a non-aqueous electrolyte power storage element, the detecting unit may detect the deterioration based on a comparison between a predetermined threshold and a ratio of the first increase rate and the second increase rate.

Further, according to the deterioration detection system for a non-aqueous electrolyte power storage element, the detecting unit may detect the deterioration based on a comparison between a predetermined threshold and a difference between the first increase rate and the second increase rate.

By the simple configuration of comparing the predetermined threshold with the ratio of or the difference between the first increase rate and the second increase rate, it is possible to detect deterioration of the non-aqueous electrolyte power storage element reliably and easily.

Further, according to the deterioration detection system for a non-aqueous electrolyte power storage element, it is preferable that the detecting unit detects the deterioration based on the first to the fourth direct current resistance values obtained by starting the measurement by the measuring unit when the power storage element is charged up to a point at which an SOC reaches 50% or higher and 100% or lower and when a value of the SOC is the same.

The higher the SOC when the direct current resistance values are measured is, the more noticeable the difference between the first increase rate and the second increase rate. Therefore, like in the above configuration, by measuring the direct current resistance values when the non-aqueous electrolyte power storage element is charged until the high SOC state (the SOC is 50% or higher and 100% or lower), deterioration of the power storage element may be detected more reliably.

According to the deterioration detection system for a non-aqueous electrolyte power storage element, when the detecting unit detects the deterioration, the charging unit may charge the non-aqueous electrolyte power storage element up to a point at which the SOC reaches 100%.

In this manner, by making the SOC of the non-aqueous electrolyte power storage element 100%, potential gradient may be applied to the positive active material as a whole. Therefore, it is possible to reduce a region in which no contribution to charging and discharging is made that has expanded in the positive electrode. With this, deterioration of the non-aqueous electrolyte power storage element (charge-discharge performance) may be recovered.

In this case, by the charging unit charging the non-aqueous electrolyte power storage element up to the point at which the SOC reaches 100%, and then performing the charge for a predetermined time period, the region in which no contribution to charging and discharging is made in the positive electrode is reduced further. Therefore, it is possible to recover deterioration of the non-aqueous electrolyte power storage element (charge-discharge performance) more reliably.

Further, a deterioration detection method for a non-aqueous electrolyte power storage element according to another aspect of the embodiment includes:

charging a non-aqueous electrolyte power storage element;

measuring a direct current resistance value of the non-aqueous electrolyte power storage element that is being charged; and detecting deterioration of an electrode assembly based on a first increase rate and a second increase rate, the first increase rate being an increase rate of a direct current resistance value before and after a use of the non-aqueous electrolyte power storage element and being obtained by measurement over a first measurement time period in the measuring, the second increase rate being an increase rate of a direct current resistance value before and after the use and being obtained by measurement over a second measurement time period in the measuring, the second time period being longer than the first measurement time period.

According to this configuration, it is possible to detect deterioration of the non-aqueous electrolyte power storage element, that is, degradation of the charge-discharge performance due to expansion of the region in which no contribution to charging and discharging is made in the positive electrode.

As the first increase rate, it is possible to employ an increase rate of a second direct current resistance value to a first direct current resistance value, the first direct current resistance value being obtained by, in the measuring, making a measurement over the first measurement time period, the second direct current resistance value being obtained by, in the measuring, making a measurement over the first measurement time period after the first direct current resistance value has been obtained.

As the second increase rate, it is possible to employ an increase rate of a fourth direct current resistance value to a third direct current resistance value, the third direct current resistance value being obtained by, in the measuring, making a measurement over the second measurement time period when the first direct current resistance value is obtained, the fourth direct current resistance value being obtained by, in the measuring, making a measurement over the second measurement time period when the second direct current resistance value is obtained.

According to the deterioration detection method for a non-aqueous electrolyte power storage element, the direct current values of the non-aqueous electrolyte power storage element are measured for two different measurement time periods respectively before and after a use of the non-aqueous electrolyte power storage element. With this, deterioration of the non-aqueous electrolyte power storage element (degradation in the charge-discharge performance) may be detected.

According to the deterioration detection method for a non-aqueous electrolyte power storage element, the second and the fourth direct current resistance values may be measured after the non-aqueous electrolyte power storage element is charged and discharged more than one time through the use after the first and third direct current resistance values have been obtained.

The more a number of charge and discharge performed during a time period after the first and the third direct current resistance values have been measured and before the second and the fourth direct current resistance values are measured, the greater the difference between the first increase rate and the second increase rate. Therefore, according to this configuration, it is possible to detect deterioration of the non-aqueous electrolyte power storage element (degradation in the charge-discharge performance) more reliably.

Further, according to the deterioration detection method for a non-aqueous electrolyte power storage element, when deterioration of the non-aqueous electrolyte power storage element is detected in the detection, the non-aqueous electrolyte power storage element may be charged up to a point at which an SOC reaches 100%.

According to this configuration, by making the SOC of the non-aqueous electrolyte power storage element 100%, potential gradient may be applied to the positive active material as a whole. Therefore, it is possible to reduce a region in which no contribution to charging and discharging is made that has expanded in the positive electrode. With this, deterioration of the non-aqueous electrolyte power storage element (charge-discharge performance) may be recovered.

As described above, according to the aspects of the embodiment, it is possible to provide a deterioration detector capable of detecting deterioration of a non-aqueous electrolyte power storage element for a non-aqueous electrolyte power storage element, a power storage device, a deterioration detection system for a non-aqueous electrolyte power storage element, and a deterioration detection method for a non-aqueous electrolyte power storage element.

Hereinafter, an embodiment of the deterioration detection system according to the present invention will be described with reference to FIG. 1 through FIG. 5. The deterioration detection system according to the embodiment detects deterioration of the non-aqueous electrolyte power storage element. First, the non-aqueous electrolyte power storage element as a target of deterioration detection will be described. Thereafter, the deterioration detection system will be described. In the embodiment, the non-aqueous electrolyte power storage element shall be simply referred to as a power storage element.

The power storage element is a lithium ion power storage element utilizing electromigration of lithium. The power storage element supplies electrical energy. One or more power storage elements are used. Specifically, the power storage element is used alone when an amount of required energy is small. On the other hand, when an amount of required energy is large, the power storage element is used in combination with a different power storage element.

Figure 2:
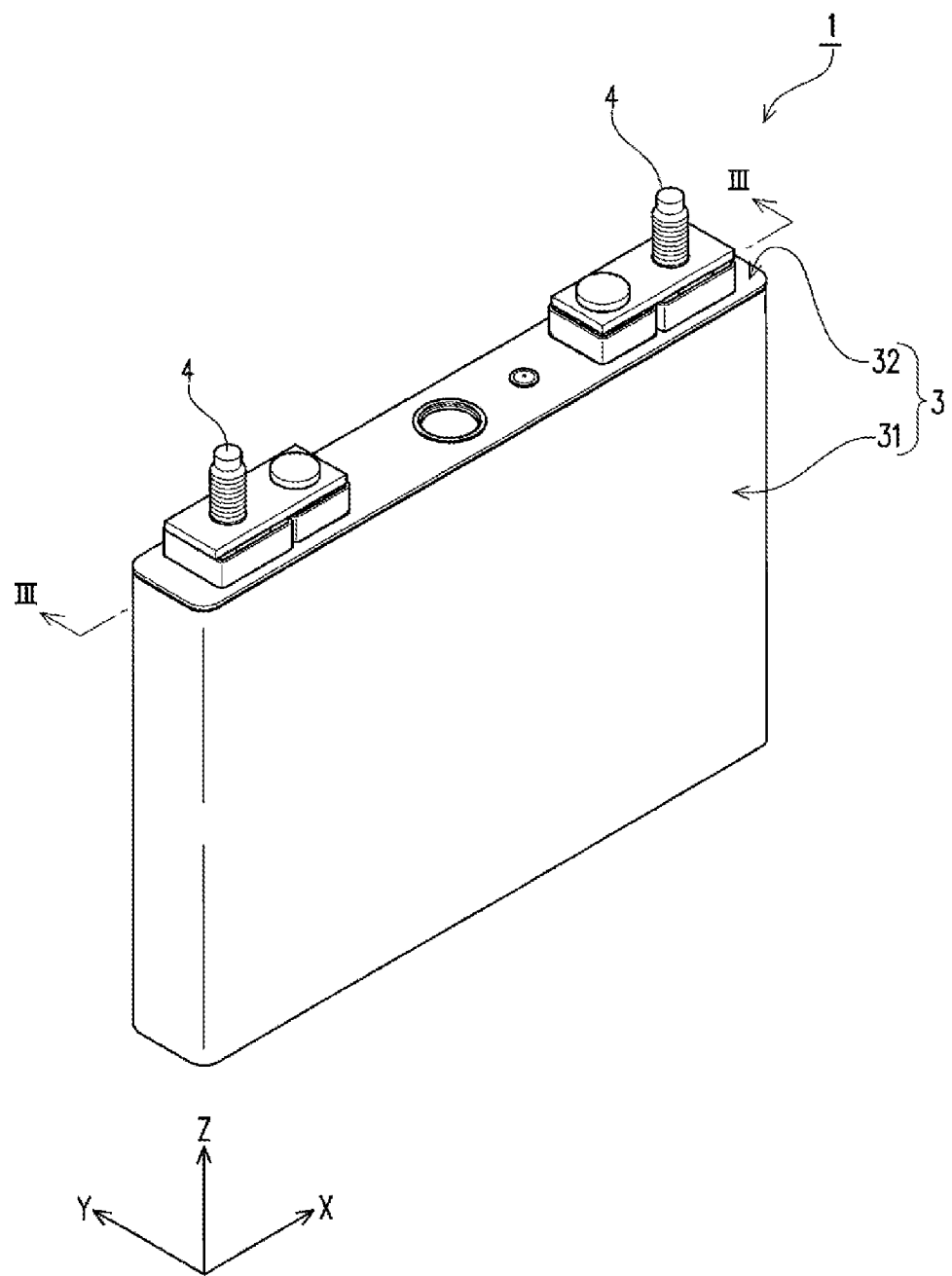
FIG. 2 is a perspective view of the non-aqueous electrolyte power storage element according to an embodiment of the present invention.
Figure 3:
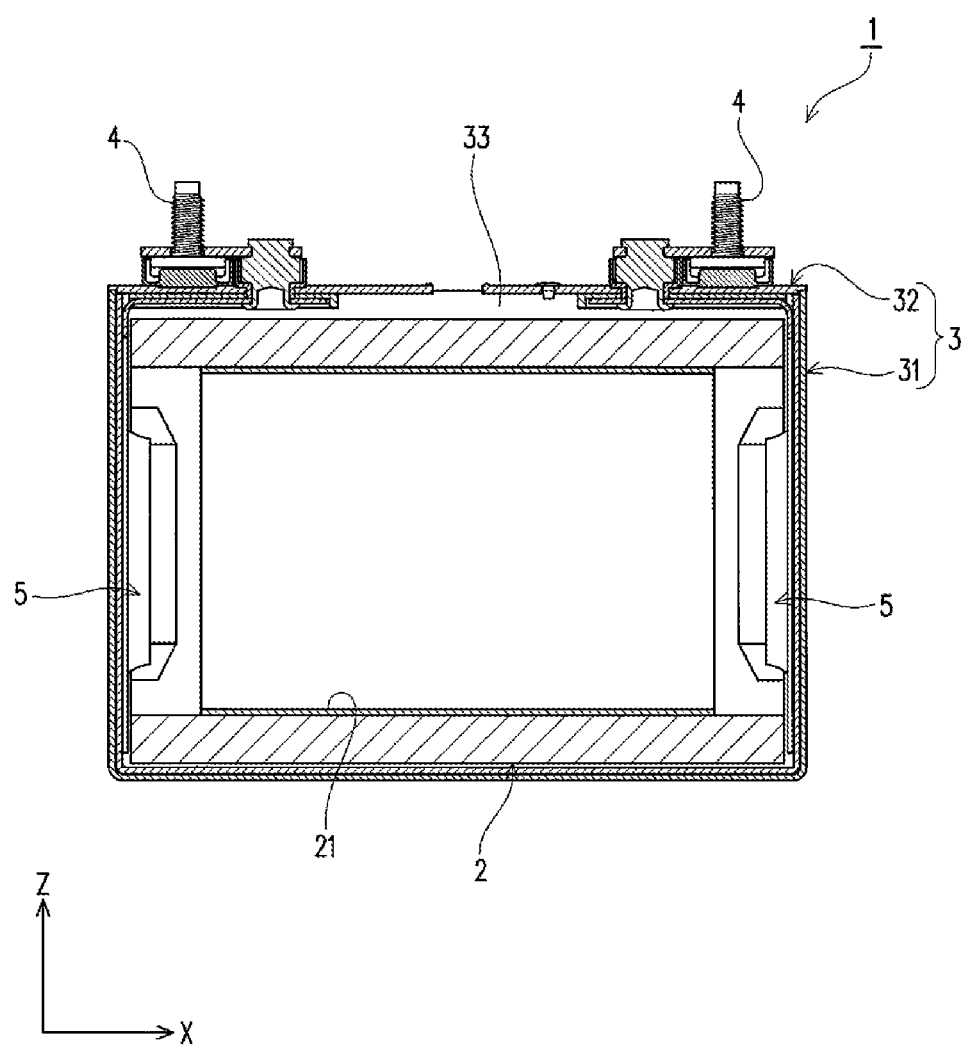
FIG. 3 is a cross-sectional view taken along line III-III in FIG. 2.
Figure 4:
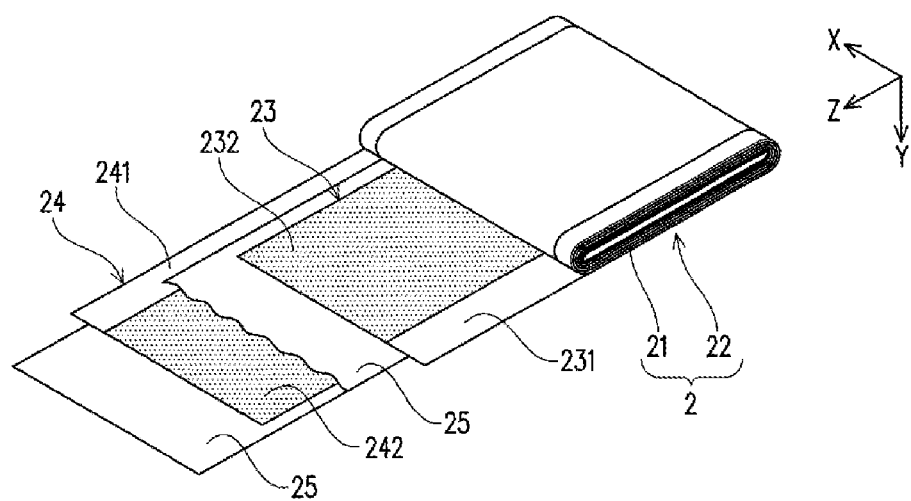
FIG. 4 is a view illustrating a configuration of an electrode assembly of the non-aqueous electrolyte power storage element according to the embodiment.

The power storage element includes an electrode assembly having a two-phase reaction type active material. As shown in FIG. 2 through FIG. 4, the power storage element includes an electrode assembly 2 having a positive electrode 23 and a negative electrode 24, a case 3 containing the electrode assembly 2, and an external terminal 4 disposed outside the case 3 and conductive to the electrode assembly 2. A power storage element 1 further includes a current collector 5 that conduct the electrode assembly 2 to the external terminal 4.

The electrode assembly 2 of the embodiment includes a winding core 21, and a layered product 22 in which the positive electrode 23 and the negative electrode 24 are stacked in a state in which the positive electrode 23 and the negative electrode 24 are insulated from each other and then wound around the winding core 21. By lithium ions moving between the positive electrode 23 and the negative electrode 24 in the electrode assembly 2, the power storage element 1 is charged and discharged.

The electrode assembly 2 may include, in place of the layered product 22 of a wound type, a stacked type layered product in which a plate-like positive electrode, a separator, and a plate-like negative electrode are stacked.

The layered product 22 of the embodiment is provided by wound around the winding core 21 in a state in which the positive electrode 23 and the negative electrode 24 are stacked (overlapped).

The positive electrode 23 includes a metal foil, and a positive active material that covers a surface of the metal foil. The metal foil is strip-shaped. Examples of the metal foil in the embodiment include an aluminium foil. The positive electrode 23 includes a positive active material uncoated portion 231 on one end portion in a widthwise direction. The uncoated portion 231 is a portion of the positive electrode 23 where a layer of the positive active material is not provided. A portion of the positive electrode 23 where a layer of the positive active material is provided is called as a coated portion 232.

The positive active material is a lithium metal oxide. The positive active material is a two-phase reaction type active material. Specifically, the positive active material is a substance expressed by a general expression $LiMPO_4$, and M is one of Fe, Mn, Cr, Co, Ni, V, Mo, and Mg. The positive active material of the embodiment is $LiFePO_4$.

The negative electrode 24 includes a metal foil, and a negative active material that covers a surface of the metal foil. The metal foil is strip-shaped. Examples of the metal foil in the embodiment include a copper foil. The negative electrode 24 includes a negative active material uncoated portion 241 on the other end portion in the widthwise direction (on a side opposite from the uncoated portion 231 of the positive electrode 23). The uncoated portion 241 is a portion of the negative electrode 24 where a layer of the negative active material is not provided. A width of a coated portion (a portion where a layer of the negative active material is provided) 242 of the negative electrode 24 is greater than a width of the coated portion 232 of the positive electrode 23.

The negative active material is a carbon material. The negative active material of the embodiment is, for example, graphite, graphitizable carbon, non-graphitizable carbon, or the like.

In the electrode assembly 2 of the embodiment, the positive electrode 23 and the negative electrode 24 thus configured are wound around in the state in which the positive electrode 23 and the negative electrode 24 are insulated by a separator 25. Specifically, in the electrode assembly 2 of the embodiment, the layered product 22 in which the positive electrode 23, the negative electrode 24, and the separator 25 are stacked together is wound around. The separator 25 is an insulating member. The separator 25 is disposed between the positive electrode 23 and the negative electrode 24. With this, the positive electrode 23 and the negative electrode 24 are insulated in the electrode assembly 2 (specifically, the layered product 22). Further, the separator 25 holds an electrolyte solution within the case 3. With this, when the power storage element 1 is charged and discharged, lithium ions move between the positive electrode 23 and the negative electrode 24 that are stacked on top of one another with the separator 25 interposed therebetween.

The case 3 includes a case main body 31 having an opening, and a cover plate 32 that covers (closes) the opening of the case main body 31. The case 3 contains the electrolyte solution along with the electrode assembly 2 and the current collector 5 within an internal space 33. The case 3 is made of a metal resistant to the electrolyte solution. The case 3 of the embodiment is made of, for example, an aluminum-based metallic material such as aluminium and an aluminum alloy. The case 3 may be made of, for example, a metallic material such as SUS and nickel, or a composite material in which a resin such as nylon is attached to aluminium.

The electrolyte solution is a non-aqueous solution based electrolyte solution. The electrolyte solution is obtained by causing electrolyte salt dissolved into an organic solvent. Examples of the organic solvent include cyclic carbonates such as propylene carbonate and ethylene carbonate, and chain carbonates such as dimethyl carbonate, diethyl carbonate, and ethyl methyl carbonate. Examples of the electrolyte salt include $LiClO_4$, $LiBF_4$, and $LiPF_6$. The electrolyte solution of the embodiment includes lithium salt, ethylene carbonate, and the like.

Next, the deterioration detection system for the power storage element 1 will be described with reference to FIG. 1 through FIG. 5. A deterioration detection system 7 for a power storage element includes a charging unit 71 for charging the power storage element 1, a measuring unit 72 for measuring a direct current resistance value of the power storage element 1 that is being charged, and a detecting unit (deterioration detector) 73 for detecting deterioration of the power storage element 1.

The charging unit 71 performs CCCV charge (constant current constant voltage charge) within a range in which an SOC is 20% or higher and 80% or lower (charge mode). Specifically, in the charge mode, the charging unit 71 charges the power storage element 1 up to a point at which the SOC reaches 80%. Further, when the detecting unit 73 detects deterioration of the power storage element 1, the charging unit 71 charges the power storage element 1 up to a point at which the SOC reaches 100% (recovery charge mode). Specifically, the charging unit 71 includes the charge mode and the recovery charge mode. In the following description, the charge in the recovery charge mode is referred to as refresh charge. A specific operation of the charging unit 71 in the recovery charge mode is described below.

Upon reception of a detection signal from the detecting unit 73, the charging unit 71 is switched to the recovery charge mode after being operated in the charge mode. Specifically, upon reception of the detection signal from the detecting unit 73, the charging unit 71 performs (continues) the charge for a predetermined time period after charging the power storage element 1 up to the point at which the SOC reaches 100%. The charging unit 71 of the embodiment continues the charge for about 4 hours after charging the power storage element 1 up to the point at which the SOC reaches 100%.

The measuring unit 72 measures a direct current resistance value that is measured when the power storage element 1 is energized for a first measurement time period (short-term resistance value), and a direct current resistance value that is measured when the power storage element 1 is energized for a second measurement time period (long-term resistance value). The second measurement time period is longer than the first measurement time period. Preferably, the second measurement time period is twice as long as the first measurement time period or longer. Specifically, the first measurement time period in the embodiment is 1 second, and the second measurement time period is 3 seconds or longer.

Further, the measuring unit 72 starts measurement for the power storage element 1 during charge at predetermined timing (when measurement starts), and measures a direct current resistance value when the first measurement time period passes after the measurement starts (short-term resistance value), and a direct current resistance value when the second measurement time period passes after the measurement starts (long-term resistance value). Specifically, the timing at which the measuring unit 72 starts measurement of the short-term resistance value and the timing at which the measuring unit 72 starts measurement of the long-term resistance value are the same.

It is preferable that the measuring unit 72 measures the direct current resistance value of the power storage element 1 in a high SOC state in which the SOC of the power storage element 1 is 50% or higher and 100% or lower. The measuring unit 72 of the embodiment starts measurement when the SOC of the power storage element 1 is 70%. As a specific example, the measuring unit 72 starts the measurement of the direct current resistance value (the short-term resistance value and the long-term resistance value) at timing in which the SOC of the power storage element 1 becomes 80% when the second measurement time period passes. The SOC (State Of Charge) indicates a charging state of the power storage element 1. Specifically, the SOC represents a ratio of a charging capacity (Ah) to a full charging capacity (Ah).

The measuring unit 72 outputs the short-term resistance value and the long-term resistance value that have been measured as resistance value signals to the detecting unit 73.

The detecting unit 73 detects deterioration of the power storage element 1 (the electrode assembly 2) based on an increase rate of the short-term resistance value that is measured over the first measurement time period by the measuring unit 72 (first increase rate), and as well as on an increase rate of the long-term resistance value that is measured over the second measurement time period by the measuring unit 72 (second increase rate).

The detecting unit 73 of the embodiment detects temporary deterioration of the power storage element 1. The temporary deterioration is recoverable deterioration. To be more specific, the temporary deterioration represents deterioration of a duration from a time point at which a state of deterioration is running into temporary deterioration from a state without temporary deterioration till a time point immediately before the state of deterioration develops into permanent deterioration. Therefore, the temporary deterioration includes stages of deterioration such as a predictive stage of temporary deterioration before temporary deterioration is produced, a development stage of temporary deterioration, and a progressive stage of temporary deterioration. Further, the progressive stage of the temporary deterioration includes a state in which temporary deterioration is accumulated. Details of the temporary deterioration of the power storage element 1 will be described later.

The detecting unit 73 detects deterioration of the electrode assembly 2 based on the first increase rate and the second increase rate. The first increase rate is an increase rate of a second short-term resistance value to a first short-term resistance value. The first short-term resistance value is obtained (measured) by the measuring unit 72 (first direct current resistance value), and the second short-term resistance value is obtained (measured) by the measuring unit 72 after the first short-term resistance value is obtained (second direct current resistance value). The second increase rate is an increase rate of a second long-term resistance value to a first long-term resistance value. The first long-term resistance value is obtained by the measuring unit 72 when the first short-term resistance value is obtained (third direct current resistance value), and the second long-term resistance value is obtained by the measuring unit 72 when the second short-term resistance value is obtained (fourth direct current resistance value).

A Specific description is as follows. The detecting unit 73 includes a recording unit 731. Upon reception of resistance value signals from the measuring unit 72 (the first short-term resistance value and the first long-term resistance value that have been measured at the same timing), the detecting unit 73 records (stores) the resistance value signals in the recording unit 731. Next, upon reception of resistance value signals from the measuring unit 72 (the second short-term resistance value and the second long-term resistance value that have been measured after the first short-term resistance value and the first long-term resistance value are measured and that have been measured at the same timing), the detecting unit 73 reads the first short-term resistance value and the first long-term resistance value that have been recorded in the recording unit 731 from the recording unit 731. Then, the detecting unit 73 obtains (calculates) the first increase rate based on the first and the second short-term resistance value, and obtains (calculates) the second increase rate based on the first and the second long-term resistance value. Subsequently, the detecting unit 73 obtains a ratio between the first increase rate and the second increase rate, detects deterioration of the electrode assembly 2 based on a comparison between the ratio and a predetermined threshold (1.33 in the example of the embodiment) previously recorded (stored) in the recording unit 731. More specifically, the detecting unit 73 determines that the electrode assembly 2 has been deteriorated when the ratio between the first increase rate and the second increase rate is greater than the predetermined threshold. Upon detection of deterioration of the electrode assembly 2, the detecting unit 73 outputs a detection signal to the charging unit 71. It should be noted that the predetermined threshold may be obtained on an empirical basis in order to detect temporary deterioration, before the deterioration develops to a large extent. Preferably, the predetermined threshold is a value obtained by multiplying a predetermined likelihood, considering a measurement error in the direct current resistance values by the measuring unit 72.

The recording unit 731 may be disposed at a position distant from the detecting unit 73. In this case, the recording unit 731 and the detecting unit 73 may communicate with each other in wire or wireless communication.

The detecting unit 73 may be provided with a central processing unit (CPU) as a control unit, and a memory in which a required operational program is recorded.

Next, a deterioration detection method for the power storage element 1 will be described with reference to FIG. 5.

The deterioration detection method for the power storage element 1 includes: charging the power storage element 1; measuring the direct current resistance values (the first and the second short-term resistance value and the first and the second long-term resistance value in the example of the embodiment) of the power storage element 1 that is being charged; and detecting deterioration of the power storage element 1 (the electrode assembly 2) based on the first increase rate and the second increase rate. In the deterioration detection of the embodiment, the temporary deterioration of the power storage element 1 (the electrode assembly 2) is detected.

The deterioration detection method for the power storage element 1 of the embodiment further includes: charging the power storage element 1 up to a point at which the SOC reaches 100% when deterioration of the power storage element 1 (temporary deterioration) is detected in the deterioration detection. A specific description is as follows.

The power storage element 1 (the power storage element 1 whose SOC is lower than 80%) is connected to the charging unit 71 and the measuring unit 72. Upon connection of the power storage element 1, the charging unit 71 charges the power storage element 1 so that the SOC is 50% or higher and 80% or lower (high SOC state) (Step S1). When the SOC of the power storage element 1 reaches 70%, the measuring unit 72 starts measurement of the direct current resistance values of the power storage element 1 (the first short-term resistance value and the first long-term resistance value) (Step S2). Once the first short-term resistance value and the first long-term resistance value are obtained by the measurement, the measuring unit 72 outputs the direct current resistance values as resistance value signals to the detecting unit 73. With this, the first short-term resistance value and the first long-term resistance value are recorded (stored) in the recording unit 731 (Step S3). During the measurement by the measuring unit 72, the power storage element 1 continues to be charged.

After the measurement of the first short-term resistance value and the first long-term resistance value, the power storage element 1 is used (that is, charged and discharged: Step S4). During the use, the power storage element 1 may be or may not be connected to the deterioration detection system 7.

Next, the power storage element 1 after use (the SOC is lower than 80%) is charged by the charging unit 71 (Step S5). During the charge, the measuring unit 72 measures the direct current resistance values of the power storage element 1 (the second short-term resistance value and the second long-term resistance value) (Step S6). Specifically, when the SOC reaches 70%, that is, when the power storage element 1 is charged up to a point at which the SOC reaches the same level as the SOC is when the measurement of the first short-term resistance value and the first long-term resistance value has been started, the measuring unit 72 starts measurement of the direct current resistance values (the second short-term resistance value and the second long-term resistance value).

Once the second short-term resistance value and the second long-term resistance value are obtained by the measurement, the measuring unit 72 outputs the direct current resistance values as resistance value signals to the detecting unit 73.

Upon reception of the resistance value signals of the second short-term resistance value and the second long-term resistance value, the detecting unit 73 reads the first short-term resistance value and the first long-term resistance value that have been recorded (stored) in the recording unit 731 from the recording unit 731. Subsequently, the detecting unit 73 calculates the first and the second increase rate based on the first and the second short-term resistance value and based on the first and the second long-term resistance value (Step S7). Next, the detecting unit 73 calculates the ratio between the first increase rate and the second increase rate that have been calculated, and compares the ratio with the predetermined threshold (1.33 in the example of the embodiment) recorded (stored) in the recording unit 731 (Step S8). Then, if the ratio between the first and the second increase rate is greater than the predetermined threshold (Step S8: Yes), the detecting unit 73 determines that temporary deterioration has been produced in the power storage element 1. On the other hand, if the ratio is not greater than the predetermined threshold (Step S8: No), the detecting unit 73 determines that there is no temporary deterioration in the power storage element 1.

When it is determined that temporary deterioration has been produced in the power storage element 1, that is, when the deterioration of the power storage element 1 is detected, the detecting unit 73 outputs a detection signal to the charging unit 71. Upon reception of the detection signal, the charging unit 71 is switched from the charge mode to the recovery charge mode (Step S9).

The charging unit 71 switched to the recovery charge mode charges up to a point at which the SOC of the power storage element 1 reaches 100%, and continues charging the power storage element 1 for a predetermined time period (e.g., 4 hours in the example of the embodiment) (Step S10). Specifically, the charging unit 71 performs the refresh charge to the power storage element 1.

On the other hand, when it is determined that there is no temporary deterioration in the power storage element 1, that is, when the deterioration of the power storage element 1 is not detected, the detecting unit 73 does not output any detection signal. With this, the charging unit 71 stops charging the power storage element 1 when the SOC of the power storage element 1 reaches 80% (Step S11).

Temporary Deterioration of Power Storage Element

Hereinafter, temporary deterioration that can be produced in a power storage element using an iron-based material as the positive active material and recovery of the temporary deterioration will be described in detail with reference to FIG. 6 and FIG. 7.

Figure 6:
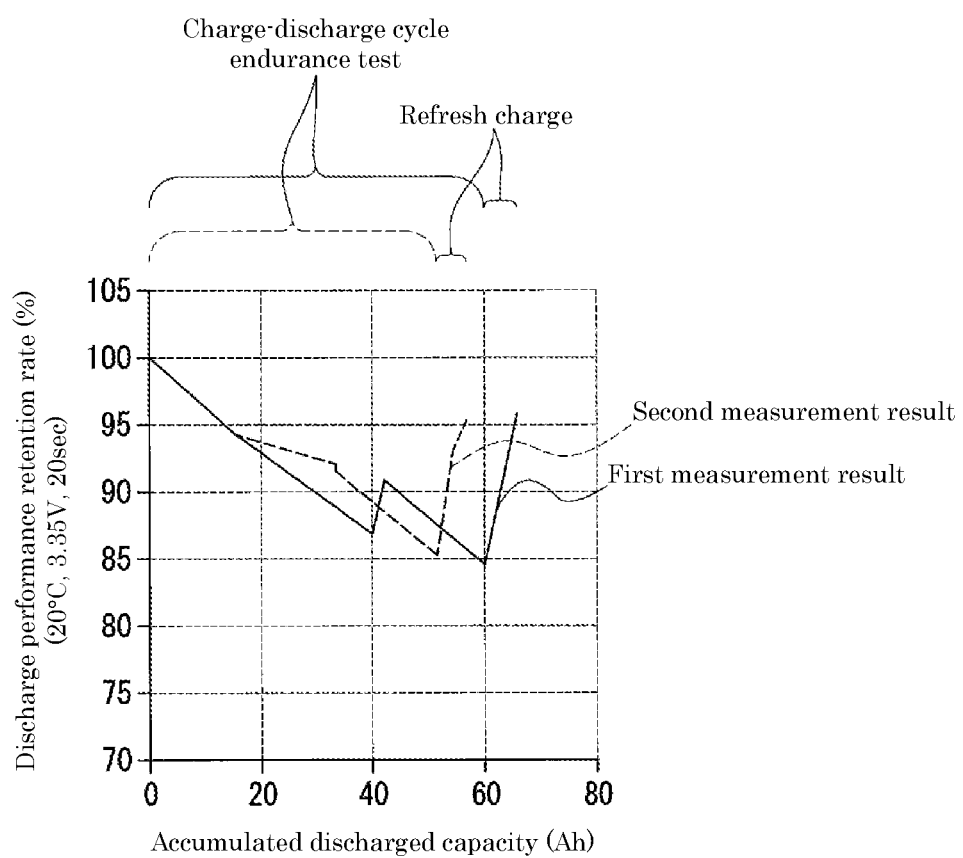
FIG. 6 is a chart showing a relation between a discharge performance retention rate and an accumulated discharged capacity of the non-aqueous electrolyte power storage element according to the embodiment.
Figure 7:
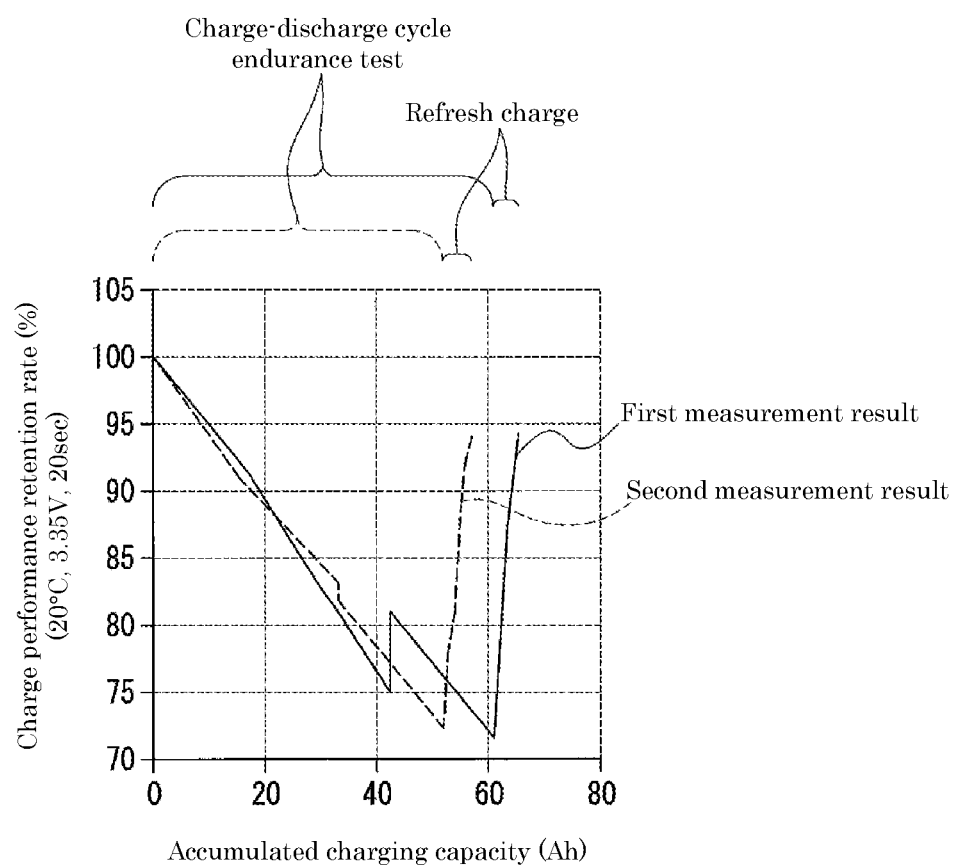
FIG. 7 is a chart showing a relation between a charge performance retention rate and an accumulated charging capacity of the non-aqueous electrolyte power storage element according to the embodiment.

FIG. 6 and FIG. 7 show results of the charge-discharge cycle endurance test performed to a power storage element using an iron-based material as the positive active material. In the charge-discharge cycle endurance test, a charge-discharge cycle at 5 CA was performed to a power storage element for 500 hours. Thereafter, a charge performance and a discharge performance of the power storage element whose SOC is 80%, which is in the high SOC state, were measured. The SOC at 80% corresponds to a cell voltage at 3.35 V. The charge performance and the discharge performance were both measured twice. In FIG. 6 and FIG. 7, the measurement results for both performances are shown separately in a solid line and a dashed line.

Thereafter, the power storage element whose discharge performance was measured in the SOC at 80% was charged up to a point at which the SOC reached 100%, and then the refresh charge in which the power storage element was charged in the SOC at 100% was continued for 60 hours.

A result of this test is shown in FIG. 6. As can be seen from FIG. 6, as an accumulated discharged capacity (Ah) increased, a discharge performance retention rate was degraded down to about 85% from 100%. By the refresh charge performed thereafter, the discharge performance retention rate was increased up to about 95%. From this result, it can be seen that deterioration of 10% out of deterioration of 15% of the discharge performance was the temporary deterioration that can be recovered by the refresh charge, and the remaining deterioration of 5% was permanent deterioration that cannot be recovered by the refresh charge.

Similarly, the power storage element whose charge performance was measured in the SOC at 80% was charged up to a point at which the SOC reached 100%, and then the refresh charge in which the power storage element was charged in the SOC at 100% was continued for 60 hours.

A result of this test is shown in FIG. 7. As can be seen from FIG. 7, as an accumulated charging capacity (Ah) increased, a charge performance retention rate was degraded down to nearly about 70% from 100%. By the refresh charge performed thereafter, the charge performance retention rate was increased up to about 95%. From this result, it can be seen that deterioration of 25% out of deterioration of 30% of the charge performance was the temporary deterioration that can be recovered by the refresh charge, and the remaining deterioration of 5% was permanent deterioration that cannot be recovered by the refresh charge.

Further, based on a comparison between the discharge performance retention rate and the charge performance retention rate, it can be seen that as the accumulated capacity of the charge-discharge capacity, the temporary deterioration of the charge performance retention rate tends to make a larger change than the temporary deterioration of the discharge performance retention rate. Specifically, a degradation rate of the charge performance retention rate during the refresh charge was about twice as large as a degradation rate of the discharge performance retention rate.

Further, recovery of deterioration of the active material during the refresh charge also tends to make a larger change for the charge performance retention rate than for the discharge performance retention rate. Specifically, a recovery rate of the charge performance retention rate during the refresh charge was about twice as large as a recovery rate of the discharge performance retention rate.

Figure 8:
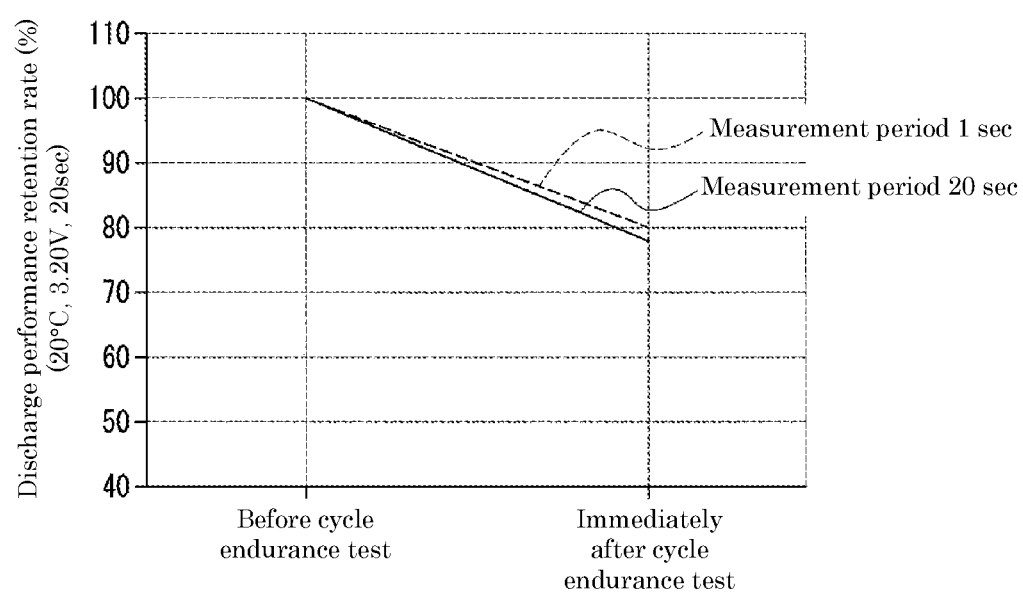
FIG. 8 is a chart showing the discharge performance retention rate of the non-aqueous electrolyte power storage element according to the embodiment, before and after a cycle endurance test.
Figure 9:
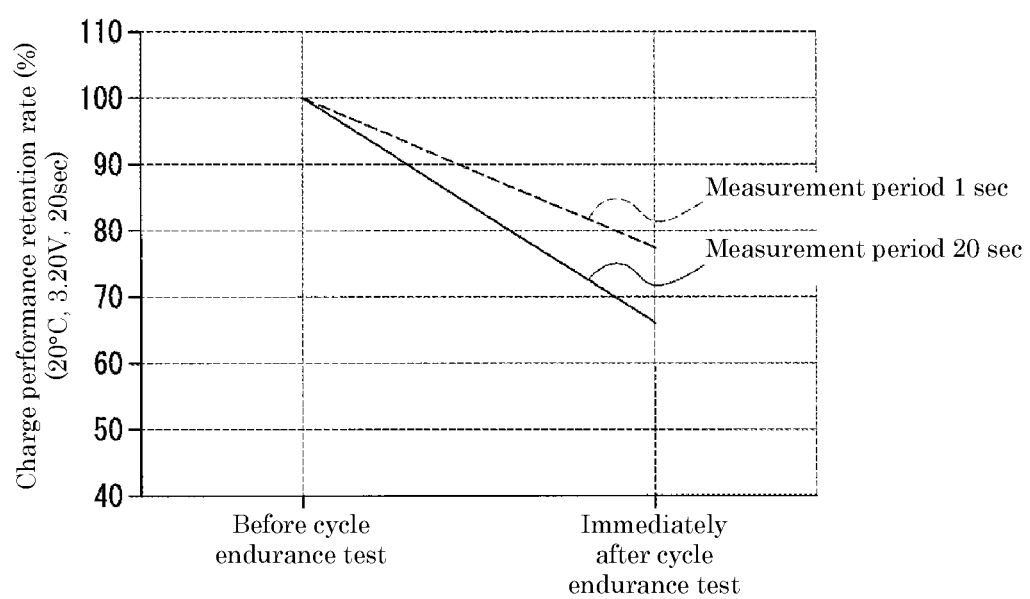
FIG. 9 is a chart showing the charge performance retention rate of the non-aqueous electrolyte power storage element according to the embodiment, before and after a cycle endurance test.

Next, an influence to a result of the measurement of the direct current resistance values given by a difference in the measurement time periods of the direct current resistance values of the power storage element when the power storage element is charged and discharged in the high SOC state after the charge-discharge cycle endurance test will be described with reference to FIG. 8 and FIG. 9. The SOC of the power storage element when the direct current resistance values are measured is 50%, which corresponds to the cell voltage 3.2V. The accumulated discharged capacity and the accumulated charging capacity are proportional to a number of charge-discharge cycles.

The direct current resistance values of the power storage element while discharging in a high SOC state after the charge-discharge cycle endurance test were measured for 1 second. At this time, as shown by a dashed line in FIG. 8, as compared to before the charge-discharge cycle endurance test, the discharge performance retention rate was degraded down to about 80%. Further, the direct current resistance value of the power storage element was measured for 20 seconds after the charge-discharge cycle endurance test while discharging in the high SOC state. At this time, as shown by a solid line in FIG. 8, as compared to before the charge-discharge cycle endurance test, the discharge performance retention rate was degraded down nearly to 80% (about 77% in FIG. 8). As can be seen from the above, when the direct current resistance value of the power storage element is measured while discharging in the high SOC state discharge, the discharge performance retention rates after the charge-discharge cycle endurance test for the case of 1 second of the measurement time period and the case of 20 seconds of the measurement time period are almost identical.

The direct current resistance values of the power storage element while charging in the high SOC state after the charge-discharge cycle endurance test were measured for 1 second. At this time, as shown by a dashed line in FIG. 9, as compared to before the charge-discharge cycle endurance test, the charge performance retention rate was degraded down to nearly about 80% (about 77% in FIG. 9). Further, the direct current resistance value of the power storage element was measured for 20 seconds after the charge-discharge cycle endurance test while charging in the high SOC state. At this time, as shown by a solid line in FIG. 9, as compared to before the charge-discharge cycle endurance test, the charge performance retention rate was degraded down to about 65%. As can be seen from the above, when the direct current resistance value of the power storage element is measured while charging in the high SOC state discharge, there was a difference of 15% between the discharge performance retention rates after the charge-discharge cycle endurance test for the case of 1 second of the measurement time period and the case of 20 seconds of the measurement time period. As described above, degradation of the charge performance retention rate after the charge-discharge cycle endurance test to the charge performance retention rate before the charge-discharge cycle endurance test is larger when the measurement time period is 20 seconds than when the measurement time period is 1 second. This shows that the charge performance retention rate is degraded to a greater extent when the measurement time period is longer than when the measurement time period is shorter.

Here, what causes the degradation in the charge performance retention rate and the discharge performance retention rate before and after the charge-discharge cycle endurance test will be described.

The positive active material of the positive electrode of the power storage element is an iron-based active material (e.g., lithium iron phosphate). As a diffusion coefficient of lithium ions is low in the lithium iron phosphate, diffusion of lithium ions within the positive active material is slow. Therefore, if the positive active material is charged unevenly when the power storage element is charged, lithium ions may not be easily diffused between particles in the lithium iron phosphate.

Further, the negative active material of the negative electrode of the power storage element is a carbon-based active material. As compared to the iron-based active material, a diffusion coefficient of lithium ions is high in the carbon-based active material, and accordingly diffusion of lithium ions within the negative active material is fast.

Therefore, due to unevenness of a current density in a planar direction slightly produced in the positive electrode and the negative electrode when the power storage element is charged and discharged, a portion through which a current easily flows becomes susceptible to charge or discharge. At this time, while lithium ions are quickly diffused in the negative electrode, lithium ions are not diffused in the positive electrode. With this, a distribution of lithium ions in the planar direction becomes unbalanced between facing surfaces of the positive electrode and the negative electrode, and charging depths becomes uneven between the positive electrode and the negative electrode, that is, a region that contributes to charge and discharge in the positive electrode 23. As a result, the charge performance and the discharge performance of the power storage element are degraded, that is, temporary deterioration of the power storage element is produced.

Here, when the charging depths become uneven, unevenness of the charging depth is resolved by charging the power storage element in the state in which the SOC is 100% so that potential gradient is given to the positive active material as a whole. Specifically, the region in which no contribution to charging and discharging is made in the positive electrode 23 becomes smaller. With this, degradation of the charge performance and the discharge performance due to unevenness of the charging depth may be recovered.

According to the deterioration detection system 7 and the deterioration detection method for the power storage element 1 described above, it is possible to detect degradation of the charge-discharge performance due to temporary deterioration of the power storage element 1, in other words, expansion of the region in which no contribution to charging and discharging is made in the positive electrode 23. Specifically, the deterioration detection system 7 for the power storage element 1 may detect temporary deterioration (degradation in the recoverable charge-discharge performance) of the power storage element 1 by measuring direct current values of the power storage element 1 (the short-term resistance value and the long-term resistance value) for two different measurement time periods (1 second and 20 seconds in the above example) before and after a use of the power storage element 1.

Further, the deterioration detection system 7 and the deterioration detection method for the power storage element 1 of the embodiment detects temporary deterioration of the power storage element 1 based on a comparison between a predetermined threshold (1.33 in the example of the embodiment) and a ratio of the first increase rate and the second increase rate. With such a simple configuration, it is possible to detect deterioration of the power storage element 1 reliably and easily.

The higher the SOC when the direct current resistance values are measured is, the more noticeable the difference between the first increase rate and the second increase rate. Therefore, like the deterioration detection system 7 of the embodiment, by measuring the direct current resistance values when the power storage element 1 is charged until the high SOC state (the state in which the SOC is 50% or higher and 100% or lower), temporary deterioration of the power storage element 1 may be detected more reliably.

According to the deterioration detection system 7 and the deterioration detection method for the power storage element 1 of the embodiment, by charging the power storage element 1 up to the point at which the SOC reaches 100% when temporary deterioration of the power storage element 1 is detected, potential gradient is applied to the positive active material as a whole. With this, it is possible to reduce the region in which no contribution to charging and discharging is made that has expanded in the positive electrode 23. As a result, temporary deterioration (degradation in the charge-discharge performance) of the power storage element 1 may be recovered.

Further, according to the deterioration detection system 7 and the deterioration detection method for the power storage element 1 of the embodiment, the charge is performed for a predetermined time period after the power storage element 1 is charged up to the point at which the SOC reaches 100%. With this, potential gradient is applied to the positive active material as a whole, and the region in which no contribution to charging and discharging is made in the positive electrode 23 is reduced further. As a result, it is possible to recover temporary deterioration (degradation in the charge-discharge performance) of the power storage element 1 more reliably.

The more a number of charge and discharge performed during a time period after the first short-term resistance value (first direct current resistance value) and the first long-term resistance value (third direct current resistance value) have been measured and before the second short-term resistance value (second direct current resistance value) and the second long-term resistance value (fourth direct current resistance value) are measured, the greater the difference between the first increase rate and the second increase rate. Therefore, according to the deterioration detection system 7 and the deterioration detection method of the embodiment, it is possible to detect temporary deterioration (degradation in the charge-discharge performance) of the power storage element 1 more reliably by measuring the second short-term resistance value (second direct current resistance value) and the second long-term resistance value (fourth direct current resistance value) after the power storage element 1 is charged and discharged more than once after the first short-term resistance value (first direct current resistance value) and the first long-term resistance value (third direct current resistance value) have been obtained.

Example

Next, an example of the deterioration detection method for a power storage element according to the embodiment will be described in the following. The power storage element used in the example is a non-aqueous electrolyte power storage element including an electrode assembly having $LiFePO_4$ as the positive active material, and a graphite-based active material as the negative active material.

First, before performing the charge-discharge cycle endurance test to the power storage element, CCCV charge is performed for 4 hours at 1 CA to make the SOC of the power storage element 50% (cell voltage 3.2 V). The power storage element in this state is charged at 5 CA, and a direct current resistance value (first short-term resistance value) $RC_{0\ h(1\ sec)}$ of the power storage element and a direct current resistance value (first long-term resistance value) $RC_{0\ h(1\ sec)}$ of the power storage element are measured while being energized respectively for 1 second and for 10 seconds. The measurement of the direct current resistance value $RC_{0\ h(1\ sec)}$ and the direct current resistance value $RC_{0\ h(10\ sec)}$ starts at the same timing.

Next, the charge-discharge cycle endurance test to the power storage element was performed at a charge current 5 CA, a discharge current 5 CA, a range of the SOC from 20% to 80%, and a temperature at 50° C. When 500 h passed after starting the charge-discharge cycle endurance test, charge and discharge to the power storage element are stopped once, and the power storage element was returned to a room temperature.

Thereafter, CCCV charge is performed for 4 hours at the charge current 1 CA, and to make the SOC of the power storage element 50% (cell voltage 3.2 V). The power storage element in this state is charged at 5 CA, and a direct current resistance value (second short-term resistance value) $RC_{500\ h(1\ sec)}$ of the power storage element and a direct current resistance value (second long-term resistance value) $RC_{500\ h(10\ sec)}$ of the power storage element are measured while being energized respectively for 1 second and for 10 seconds. At this time, the measurement of the direct current resistance value $RC_{500\ h(1\ sec)}$ and the direct current resistance value $RC_{500\ h(10\ sec)}$ also starts at the same timing.

Then, based on the direct current resistance value $RC_{0\ h(1\ sec)}$ for 1 second of energization (when energized for 1 second) measured in the before the charge-discharge cycle endurance test and the direct current resistance value $RC_{500\ h(1\ sec)}$ for 1 second of energization measured after the charge-discharge cycle endurance test for 500 hours, an input deterioration rate (first increase rate) $AC_{500\ h(1\ sec)}$ after the charge-discharge cycle endurance test for 500 hours is calculated. A calculation formula for the input deterioration rate $AC_{500\ h(1\ sec)}$ after the charge-discharge cycle endurance test for 500 hours is as follows.

$$AC_{500h(1sec)} = \frac{RC_{500h(1sec)}}{RC_{0h(1sec)}} \quad (1)$$

Further, based on the direct current resistance value $RC_{0\ h(10\ sec)}$ for 10 seconds of energization (when energized for 10 seconds) measured before the charge-discharge cycle endurance test and the direct current resistance value $RC_{500\ h(10\ sec)}$ for 10 seconds of energization measured after the charge-discharge cycle endurance test for 500 hours, an input deterioration rate (second increase rate) $AC_{500\ h(10\ sec)}$ after the charge-discharge cycle endurance test for 500 hours is calculated. A calculation formula for the input deterioration rate $AC_{500\ h(10\ sec)}$ after the charge-discharge cycle endurance test for 500 hours is as follows.

$$AC_{500h(10sec)} = \frac{RC_{500h(10sec)}}{RC_{0h(10sec)}} \quad (2)$$

Next, an increase ratio r between the input deterioration rate $AC_{500\ h(1\ sec)}$ for 1 second of energization after the charge-discharge cycle endurance test for 500 hours and the input deterioration rate $AC_{500\ h(10\ sec)}$ for 10 seconds of energization after the charge-discharge cycle endurance test for 500 hours (ratio between the first increase rate and the second increase rate) is calculated. A calculation formula for the increase ratio r is as follows.

$$r = \frac{AC_{500h(10sec)}}{AC_{500h(1sec)}} \quad (3)$$

When the increase ratio r is a predetermined threshold (1.33 in this example) or higher, it is considered that temporary deterioration is produced in the power storage element, and the refresh charge is performed. The refresh charge in this example is performed to the power storage element whose SOC is 100% (cell voltage 3.55 V) for 12 hours at the charge current 1 CA.

Then, after the refresh charge, the charge-discharge cycle endurance test for 500 hours is started again.

On the other hand, the increase ratio r is lower than the predetermined threshold (1.33 in this example), it is considered that temporary deterioration is no produced in the power storage element, the charge-discharge cycle endurance test for 500 hours is further performed.

The charge-discharge cycle endurance test and the refresh charge were repeated until a total time length of the charge-discharge cycle endurance test reaches 5000 hours. The calculated increase ratio r was higher than 1.33 after 1000 hours, 2000 hours, 3000 hours, 4000 hours, and 5000 hours, the refresh charge was performed at those timings.

A 10-second charge performance maintaining rate after 5000 hours passed, when the charge was started in the state in which the SOC was 50%, and the direct current resistance value of the power storage element was measured for 10 seconds while the power storage element was being charged (energized) was 94.5%.

On the other hand, as a comparison example, a power storage element having the same configuration as the above example was subjected to the charge-discharge cycle endurance test under the same conditions as the above example continuously for 5000 hours. As a result, the 10-second charge performance maintaining rate after 5000 hours passed, when the charge was started in the state in which the SOC was 50%, and the direct current resistance value of the power storage element was measured for 10 seconds while the power storage element was being charged (energized) was 72.5%.

As described above, as the 10 seconds charge performance maintaining rate when the SOC is 50%, the value of the power storage element of the comparison example is lower than the value of the power storage element of the example to which the refresh charge is performed. From this result, it can be seen that degradation of the charge performance is suppressed.

It should be appreciated that the deterioration detector for a non-aqueous electrolyte power storage element, the power storage device, the deterioration detection system for a non-aqueous electrolyte power storage element, and the deterioration detection method for a non-aqueous electrolyte power storage element according to the present invention are not limited to the above embodiment, and may be modified variously without departing from the scope of the invention.

The embodiment describes the example of the deterioration detection system 7 and the deterioration detection method for one power storage element 1, but the present invention is not limited to this example. The deterioration detection system and the deterioration detection method may be applied to one or more power storage elements that constitute a power storage device (such as a battery module) having a plurality of power storage elements. Applications of such power storage elements include vehicles, electric power distribution, and mobile devices.

Further, the deterioration detection system 7 and the deterioration detection method for the power storage element 1 according to the above embodiment are configured such that the detecting unit 73 detects temporary deterioration of the power storage element 1 based on the ratio between the first increase rate and the second increase rate, but the present invention is not limited to this example. For example, the detecting unit 73 may detect temporary deterioration of the power storage element 1 based on a comparison or a difference between the first increase rate and the second increase rate. Specifically, it is sufficient that the detecting unit 73 is configured to detect deterioration of the power storage element 1 based on the first increase rate and the second increase rate.

Further, the positive active material of the electrode assembly 2 according to the above embodiment is, but not limited to, LiFePO$_4$. It is sufficient that the positive active material of the electrode assembly 2 is a two-phase reaction type active material. Specifically, it is sufficient that the positive active material is a substance expressed by a general expression LiMPO$_4$, and that M is one of Fe, Mn, Cr, Co, Ni, V, Mo, and Mg. With this, the deterioration detection system 7 and the deterioration detection method according to the above embodiment may provide the same effects as in the above embodiment for the power storage element including the electrode assembly having the positive active material.

Further, the deterioration detection system 7 and the deterioration detection method according to the above embodiment are configured such that the refresh charge is performed, but the present invention is not limited to this example. For example, the deterioration detection system 7 and the deterioration detection method for the power storage element 1 may be intended only to detect deterioration (e.g., temporary deterioration) of the power storage element 1. Specifically, the deterioration detection system 7 and the deterioration detection method for the power storage element 1 may be configured not to perform refresh charge.

Further, the deterioration detection system 7 for the power storage element 1 according to the above embodiment may be a system that is used alone, and may be incorporated into a different system employing the power storage element 1, such as a charging system and a discharging system, for example. Further, the deterioration detection system 7 for the power storage element 1 may be incorporated into a device or the like that employs one or more power storage elements 1 as a power source.

Further, the deterioration detection system for the power storage element according to the above example is configured such that temporary deterioration is detected every time the predetermined time period (500 hours in the above example) passes, that is, at a constant period after the measuring unit starts the charge-discharge cycle endurance test, but the present invention is not limited to this example. For example, the period for detecting temporary deterioration may be shorter as the number of charge-discharge cycles increases, or may be altered based on a state of temporary deterioration (a magnitude of the increase ratio r).

The deterioration detection system 7 and the deterioration detection method for the power storage element 1 according to the above embodiment are configured such that deterioration of the power storage element 1 is detected by measuring the direct current resistance value two times before and after a use of the power storage element 1 (the use includes at least one of charging and discharging, such as the charge-discharge cycle endurance test), but the present invention is not limited to this example. The deterioration detection system 7 and the deterioration detection method for the power storage element 1 may be configured to measure the direct current resistance values three times or more. In this case, the detecting unit 73 records (stores) the first short-term resistance value and the first long-term resistance value that have been obtained in a first measurement performed to the power storage element 1 before the use in the recording unit 731 during detection of deterioration, for example. Then, the detecting unit 73 takes a short-term resistance value and a long-term resistance value obtained in n-th measurement and after (n: natural number that is 2 or more) as the second short-term resistance value and the second long-term resistance value, and obtains the first increase rate and the second increase rate based on the first short-term resistance value and the first long-term resistance value recorded (stored) in the recording unit 731, and the second short-term resistance value and the second long-term resistance value obtained in the n-th measurement.

The refresh charge according to the above embodiment is performed by continuing charging even when the SOC of the power storage element 1 reaches 100% by charging, but the present invention is not limited to this example. For example, the refresh charge may be stopped once when the SOC of the power storage element 1 reaches 100%, and then restart charging after a predetermined time period (e.g., a few seconds to several ten seconds) passes.

In the deterioration detection system 7 and the deterioration detection method for the power storage element 1 of the above embodiment, the use of the power storage element 1 between the measurement of the first short-term resistance value and the first long-term resistance value and the measurement of the second short-term resistance value and the second long-term resistance value is not particularly limited. For example, the use may be used for a power source for a tool or a machine and such that the value of the SOC changes every time when charge or discharge is started, or such that the value of the SOC when charge or discharge is started is constant as in the charge-discharge cycle endurance test.

In the deterioration detection system 7 and the deterioration detection method for the power storage element 1 according to the above embodiment, the measurement of the short-term resistance value and the long-term resistance value is performed in the high SOC state, but the present invention is not limited to this example. For example, the measurement of the short-term resistance value and the long-term resistance value may be performed in a low SOC state (the SOC is higher than 0% and lower than 50%). Even if the first and the second increase rate are obtained (calculated) using the direct current resistance values measure in the low SOC state, it is possible to detect temporary deterioration of the power storage element 1 based on a slight change in the first and the second increase rate.

Figure 10:
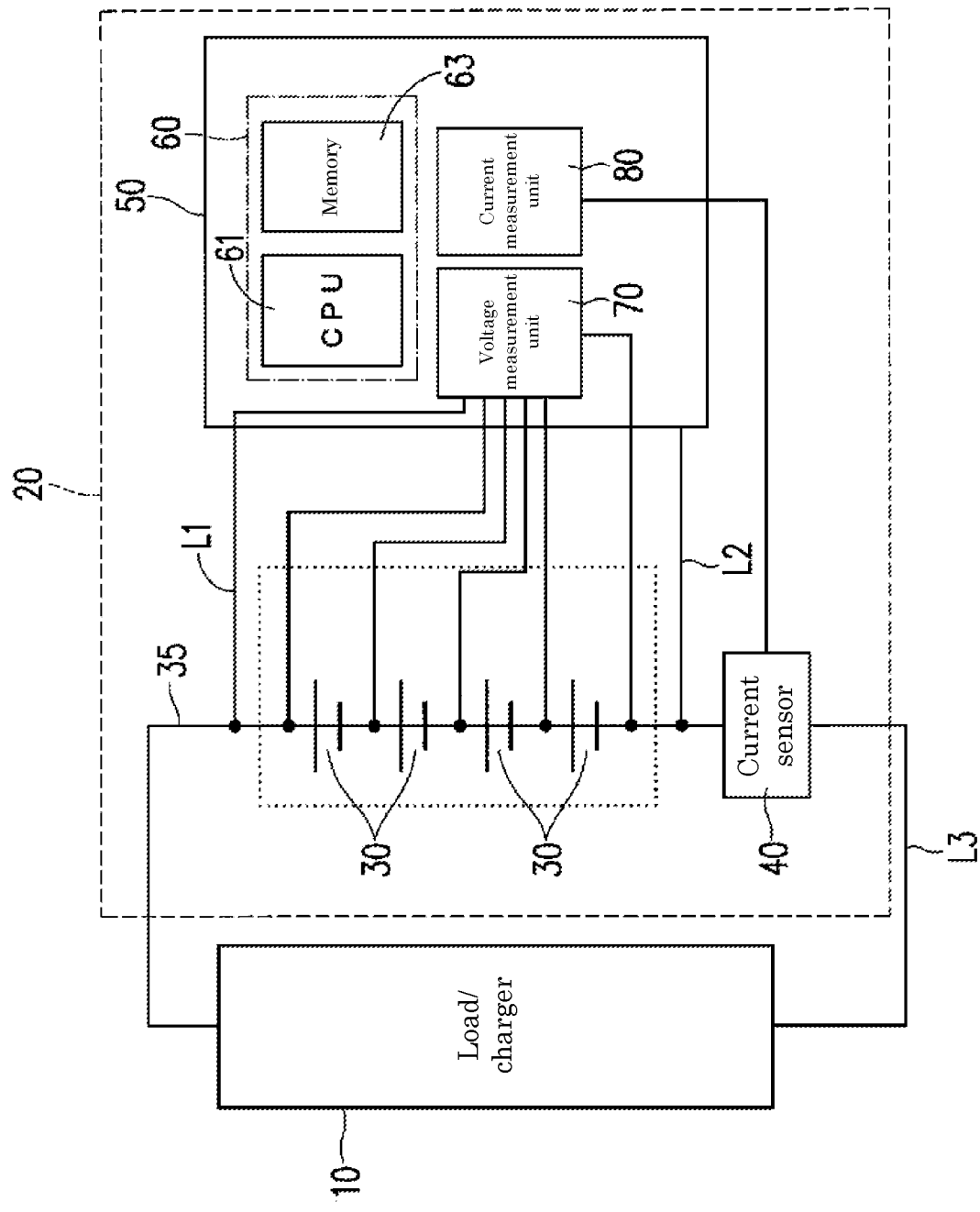
FIG. 10 is a block diagram of a battery module (power storage device) according to another embodiment.

FIG. 10 is a block diagram illustrating a battery module (power storage device) 20 according to another embodiment. The battery module 20 may include a plurality of serially connected non-aqueous electrolyte power storage elements 30, a battery manager 50 that manages the power storage elements 30, and a current sensor 40 that detects a current flowing through the power storage elements 30. The battery module 20 is charged by a charger 10, and supplies direct current power to an inverter (load 10) that drives a motor for driving a vehicle or the like. The power storage elements 30 may be lithium ion batteries including, for example, a graphite-based negative active material and an iron phosphate based positive active material such as LiFePO$_4$.

The battery manager 50 includes a control unit 60, a voltage measurement unit 70, and a current measurement unit 80. The control unit 60 includes a central processing unit (CPU) 61, and a memory 63. The memory 63 records various programs for controlling an operation of the battery manager 50. The battery manager 50 may be configured by mounting various devices on one or more substrates.

The voltage measurement unit 70 is connected to both terminals of the power storage elements 30 via voltage detection lines, and measures a voltage V (V) of each of the power storage elements 30 at predetermined intervals. The current measurement unit 80 measures a current flowing through the power storage elements 30 via the current sensor 40.

The battery module 20 may be a battery module for driving electric vehicles such as an electric vehicle (EV), a hybrid electric vehicle (HEV), and a plug-in hybrid electric vehicle (PHEV). It is possible to perform charging using an alternator in a short time period and at a high current (e.g., up to 10 CA, 10-30 seconds).

Figure 5:
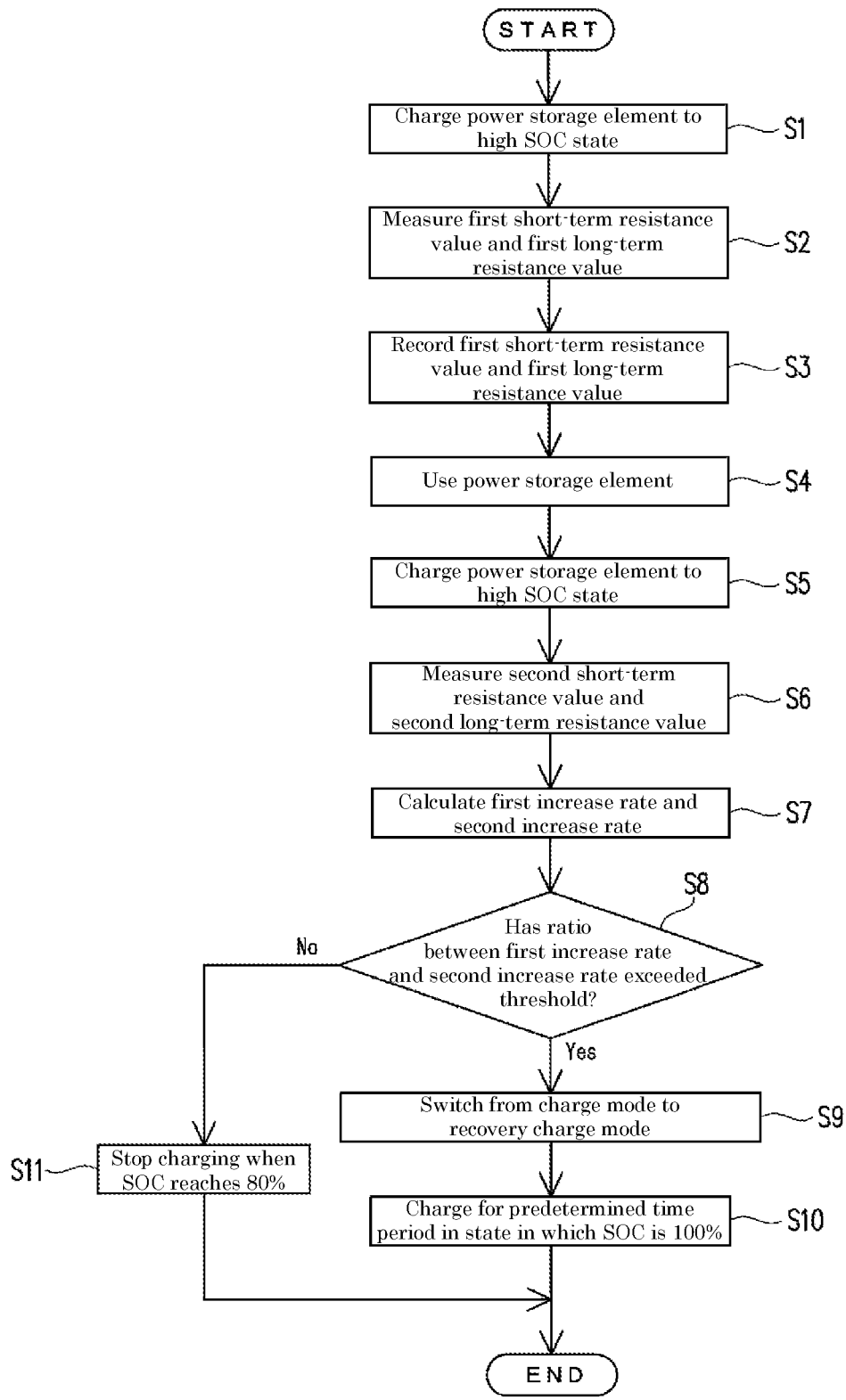
FIG. 5 is a flowchart showing a control flow of the deterioration detection system for the non-aqueous electrolyte power storage element according to the embodiment.

When the battery module 20 is used to drive a PHEV, the battery module 20 may perform the deterioration detection method shown in FIG. 5 once a month. The battery module 20 may perform the deterioration detection method shown in FIG. 5 in a routine vehicle inspection that takes place once two years.

Alternatively, the battery module 20 may perform the deterioration detection method shown in FIG. 5 daily or once in two to three days, for example, during plug-in charge using an electric outlet for household use (0.2-1 CA, a few hours).

The battery module 20 may be configured as a battery pack containing the power storage elements 30, the current sensor 40, and the battery manager 50 in a single container. The battery pack may be a starter battery for starting engines (12 V power source) mounted on moving vehicles such as vehicles, trains, ships, and airplanes.

The battery module 20 may be a 48 V power source for assisting vehicle driving. In this case, the battery module 20 may also perform the deterioration detection method shown in FIG. 5 at the same timing as in the use for driving a PHEV.

In the example shown in FIG. 10, the container containing the power storage elements 30 also includes the control unit 60, but the present invention is not limited to such an example. The control unit may be disposed at a position distant from the power storage elements. For example, a control unit mounted on a vehicle may serve as the control unit for the deterioration detector.

The invention claimed is:

1. A deterioration detector for a non-aqueous electrolyte power storage element, the deterioration detector comprising:
    a processor; and
    a memory that stores instructions to cause the processor to perform:
        calculating a first increase rate based on first resistance values of the non-aqueous electrolyte power storage element measured over a first time period, and a second increase rate based on second resistance values of the non-aqueous electrolyte power storage element measured over a second time period longer than the first time period; and
        detecting deterioration of the non-aqueous electrolyte power storage element based on one of:
            a ratio of the first increase rate and the second increase rate; and
            a difference between the first increase rate and the second increase rate.

2. The deterioration detector according to claim 1, wherein
    the first increase rate is an increase rate of a second direct current resistance value to a first direct current resistance value, the first direct current resistance value being obtained by measuring the non-aqueous electrolyte power storage element over the first time period, the second direct current resistance value being obtained by measuring the non-aqueous electrolyte power storage element over the first time period after the first direct current resistance value has been obtained,
    the second increase rate is an increase rate of a fourth direct current resistance value to a third direct current resistance value, the third direct current resistance value being obtained by measuring the non-aqueous electrolyte power storage element over the second time period when the first direct current resistance value is obtained, the fourth direct current resistance value being obtained by measuring the non-aqueous electrolyte power storage element over the second time period when the second direct current resistance value is obtained.

3. The deterioration detector for a non-aqueous electrolyte power storage element according to claim 2, wherein
    the processor detects the deterioration based on a comparison between a predetermined threshold and the ratio of the first increase rate and the second increase rate.

4. The deterioration detector for a non-aqueous electrolyte power storage element according to claim 2, wherein
    the processor detects the deterioration based on a comparison between a predetermined threshold and the difference between the first increase rate and the second increase rate.

5. The deterioration detector for a non-aqueous electrolyte power storage element according to claim 2, wherein
    the processor detects the deterioration based on the first to the fourth direct current resistance values obtained by starting the measurement of the non-aqueous electrolyte power storage element when the non-aqueous electrolyte power storage element is charged up to a point at which an SOC reaches 50% or higher and 100% or lower as well as when a value of the SOC is the same.

6. The deterioration detector for a non-aqueous electrolyte power storage element according to claim 1, wherein
    when the deterioration is detected, the processor outputs a signal for charging the non-aqueous electrolyte power storage element up to the point at which the SOC reaches 100%.

7. The deterioration detector for a non-aqueous electrolyte power storage element according to claim 6, wherein
    after the non-aqueous electrolyte power storage element is charged up to the point at which the SOC reaches 100%, the processor outputs a signal for continuing to charge the non-aqueous electrolyte power storage element for a predetermined time period.

8. A power storage device comprising:
    a non-aqueous electrolyte power storage element;
    a measuring unit configured to measure a direct current resistance value of the non-aqueous electrolyte power storage element; and
    the deterioration detector according to claim 1.

9. The power storage device according to claim 8, wherein
    the non-aqueous electrolyte power storage element includes an electrode assembly having a two-phase reaction type active material.

10. The power storage device according to claim 8, wherein
    the measuring unit measures a direct current resistance value of the non-aqueous electrolyte power storage element that is being charged.

11. A deterioration detection system for a non-aqueous electrolyte power storage element, the deterioration detection system comprising:

a charging unit configured to charge the non-aqueous electrolyte power storage element; and the power storage device according to claim 8.

12. A deterioration detection method for a non-aqueous electrolyte power storage element, the method comprising:
charging a non-aqueous electrolyte power storage element including an electrode assembly;
measuring first resistance values of the non-aqueous electrolyte power storage element over a first time period, and second resistance values of the non-aqueous electrolyte power storage element over a second time period longer than the first time period;
calculating a first increase rate based on the first resistance values, and a second increase rate based on the second resistance values; and
detecting deterioration of the electrode assembly based on one of:
a ratio of the first increase rate and the second increase rate; and
a difference between the first increase rate and the second increase rate.

13. The deterioration detection method for a non-aqueous electrolyte power storage element according to claim 12, wherein the electrode assembly comprises a two-phase reaction type active material.

14. The deterioration detection method for a non-aqueous electrolyte power storage element according to claim 12, wherein
in the measuring, the direct current resistance value of the non-aqueous electrolyte power storage element that is being charged is measured.

15. The deterioration detection method for a non-aqueous electrolyte power storage element according to claim 12, wherein
the first increase rate is an increase rate of a second direct current resistance value to a first direct current resistance value, the first direct current resistance value being obtained by, in the measuring, making a measurement over the first time period, the second direct current resistance value being obtained by, in the measuring, making a measurement over the first time period after the first direct current resistance value has been obtained,
the second increase rate is an increase rate of a fourth direct current resistance value to a third direct current resistance value, the third direct current resistance value being obtained by, in the measuring, making a measurement over the second time period when the first direct current resistance value is obtained, the fourth direct current resistance value being obtained by, in the measuring, making a measurement over the second time period when the second direct current resistance value is obtained.

16. The deterioration detection method for a non-aqueous electrolyte power storage element according to claim 15, wherein
the second and the fourth direct current resistance values are measured after the non-aqueous electrolyte power storage element is charged and discharged more than one time through the use after the first and third direct current resistance values have been obtained.

17. The deterioration detection method for a non-aqueous electrolyte power storage element according to claim 12, wherein
when deterioration of the non-aqueous electrolyte power storage element is detected in the detecting, the non-aqueous electrolyte power storage element is charged up to a point at which an SOC reaches 100%.

18. A deterioration detection system comprising:
a charging unit that charges a power storage element;
a measuring unit that:
measures first resistance values of the power storage element over a first time period; and
measures second resistance values of the power storage element over a second time period longer than the first time period; and
a detecting unit that:
calculates a first increase rate based on the first resistance values;
calculates a second increase rate based on the second resistance values; and
detects deterioration of an electrode assembly in the power storage element based on one of:
a ratio of the first increase rate and the second increase rate; and
a difference between the first increase rate and the second increase rate.

19. The deterioration detection system of claim 18, wherein the detecting unit detects the deterioration by:
calculating a ratio of the first increase rate to the second increase rate; and
comparing the calculated ratio to a threshold value.

20. The deterioration detection system of claim 19, wherein if the calculated ratio is greater than the threshold value, then the detecting unit outputs a detection signal to the charging unit to cause the charging unit to switch to recovery charge mode in order to refresh charge the power storage element.

* * * * *